(12) United States Patent
Matsuno

(10) Patent No.: US 9,263,525 B2
(45) Date of Patent: Feb. 16, 2016

(54) SILICON CARBIDE SEMICONDUCTOR DEVICE AND MANUFACTURING METHOD THEREOF

(71) Applicant: Yoshinori Matsuno, Tokyo (JP)

(72) Inventor: Yoshinori Matsuno, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/735,095

(22) Filed: Jan. 7, 2013

(65) Prior Publication Data

US 2013/0234160 A1    Sep. 12, 2013

(30) Foreign Application Priority Data

Mar. 9, 2012    (JP) .................. 2012-052546

(51) Int. Cl.
*H01L 21/78*    (2006.01)
*H01L 29/16*    (2006.01)
(Continued)

(52) U.S. Cl.
CPC .......... *H01L 29/1608* (2013.01); *H01L 21/045* (2013.01); *H01L 21/78* (2013.01); *H01L 23/293* (2013.01); *H01L 23/3185* (2013.01); *H01L 24/03* (2013.01); *H01L 29/6606* (2013.01); *H01L 29/872* (2013.01); *H01L 24/05* (2013.01); *H01L 24/06* (2013.01); *H01L 2224/0345* (2013.01); *H01L 2224/0381* (2013.01); *H01L 2224/0382* (2013.01); *H01L 2224/04042* (2013.01); *H01L 2224/0518* (2013.01); *H01L 2224/05155* (2013.01); *H01L 2224/05166* (2013.01); *H01L 2224/05184* (2013.01); *H01L 2224/05564* (2013.01); *H01L 2224/05567* (2013.01); *H01L 2224/05624* (2013.01); *H01L 2224/05644* (2013.01); *H01L 2224/05655* (2013.01); *H01L 2224/06181* (2013.01); *H01L 2224/94* (2013.01); *H01L 2924/00014* (2013.01); *H01L 2924/10272* (2013.01); *H01L 2924/12032* (2013.01); *H01L 2924/1306* (2013.01); *H01L 2924/13052* (2013.01); *H01L 2924/13091* (2013.01)

(58) Field of Classification Search
None
See application file for complete search history.

(56) References Cited

U.S. PATENT DOCUMENTS

| 7,230,273 B2 | 6/2007 | Kitabatake et al. |
| 7,825,017 B2 | 11/2010 | Yamamoto et al. |

(Continued)

FOREIGN PATENT DOCUMENTS

| CN | 1572025 A | 1/2005 |
| JP | 10-177974 A | 6/1998 |

(Continued)

OTHER PUBLICATIONS

An Office Action; "Decision of Refusal," issued by the Korean Patent Office on Aug. 12, 2014, which corresponds to Korean Patent Application No. 10-2013-0019632 and is related to U.S. Appl. No. 13/735,095; with partial English translation.

(Continued)

*Primary Examiner* — Stanetta Isaac
(74) *Attorney, Agent, or Firm* — Studebaker & Brackett PC

(57) ABSTRACT

The present invention includes an n+ type substrate, a drift epitaxial layer formed on the n+ type substrate and having a lower concentration of impurity than the n+ type substrate, a Schottky electrode formed on the drift epitaxial layer, and a PI formed as an insulating film by covering at least an end of the Schottky electrode and an end and a side surface of the drift epitaxial layer.

5 Claims, 12 Drawing Sheets

(51) Int. Cl.
*H01L 21/04* (2006.01)
*H01L 23/29* (2006.01)
*H01L 23/31* (2006.01)
*H01L 23/00* (2006.01)
*H01L 29/66* (2006.01)
*H01L 29/872* (2006.01)

(56) References Cited

U.S. PATENT DOCUMENTS

| | | | |
|---|---|---|---|
| 2004/0248330 A1* | 12/2004 | Kitabatake et al. | 438/17 |
| 2005/0029646 A1* | 2/2005 | Ueda et al. | 257/687 |
| 2005/0130390 A1* | 6/2005 | Andrews et al. | 438/458 |
| 2005/0161732 A1* | 7/2005 | Mizukami et al. | 257/327 |
| 2006/0003477 A1* | 1/2006 | Braune et al. | 438/29 |
| 2008/0093637 A1* | 4/2008 | Sankin et al. | 257/263 |
| 2008/0179611 A1* | 7/2008 | Chitnis et al. | 257/98 |
| 2009/0174023 A1 | 7/2009 | Takahashi et al. | |
| 2009/0236611 A1 | 9/2009 | Yamamoto et al. | |
| 2009/0267082 A1 | 10/2009 | Yamamoto et al. | |
| 2010/0276703 A1* | 11/2010 | Tanimoto | 257/77 |
| 2011/0115058 A1* | 5/2011 | Mieczkowski et al. | 257/620 |
| 2011/0193128 A1* | 8/2011 | Lee et al. | 257/99 |

FOREIGN PATENT DOCUMENTS

| | | |
|---|---|---|
| JP | H11-162889 A | 6/1999 |
| JP | 2000-183282 A | 6/2000 |
| JP | 2000-269166 A | 9/2000 |
| JP | 2004-064028 A | 2/2004 |
| JP | 2005-012206 A | 1/2005 |
| JP | 2006-156658 A | 6/2006 |
| JP | 2009-224641 A | 10/2009 |
| JP | 2009-231321 A | 10/2009 |
| JP | 2009-267032 A | 11/2009 |
| JP | 2010-056312 A | 3/2010 |

OTHER PUBLICATIONS

An Office Action; "Notice of Disapproval of Amendment," issued by the Korean Patent Office on Oct. 20, 2014, which corresponds to Korean Patent Application No. 10-2013-0019632 and is related to U.S. Appl. No. 13/735,095; with partial English translation.

An Office Action; "Result of Reexamination," issued by the Korean Patent Office on Oct. 20, 2014, which corresponds to Korean Patent Application No. 10-2013-0019632 and is related to U.S. Appl. No. 13/735,095; with partial English translation.

The first Office Action issued by the Korean Patent Office on Feb. 13, 2014, which corresponds to Korean Patent Application No. 2013-0019632 and is related to U.S. Appl. No. 13/735,095; with partial English translation.

An Office Action; "Notice of Reasons for Rejection," issued by the Japanese Patent Office on Mar. 17, 2015, which corresponds to Japanese Patent Application No. 2012-052546 and is related to U.S. Appl. No. 13/735,095; with English language partial translation.

The first Office Action issued by the Chinese Patent Office on Mar. 30, 2015, which corresponds to Chinese Patent Application No. 201210582270.9 and is related to U.S. Appl. No. 13/735,095; with English language translation.

* cited by examiner

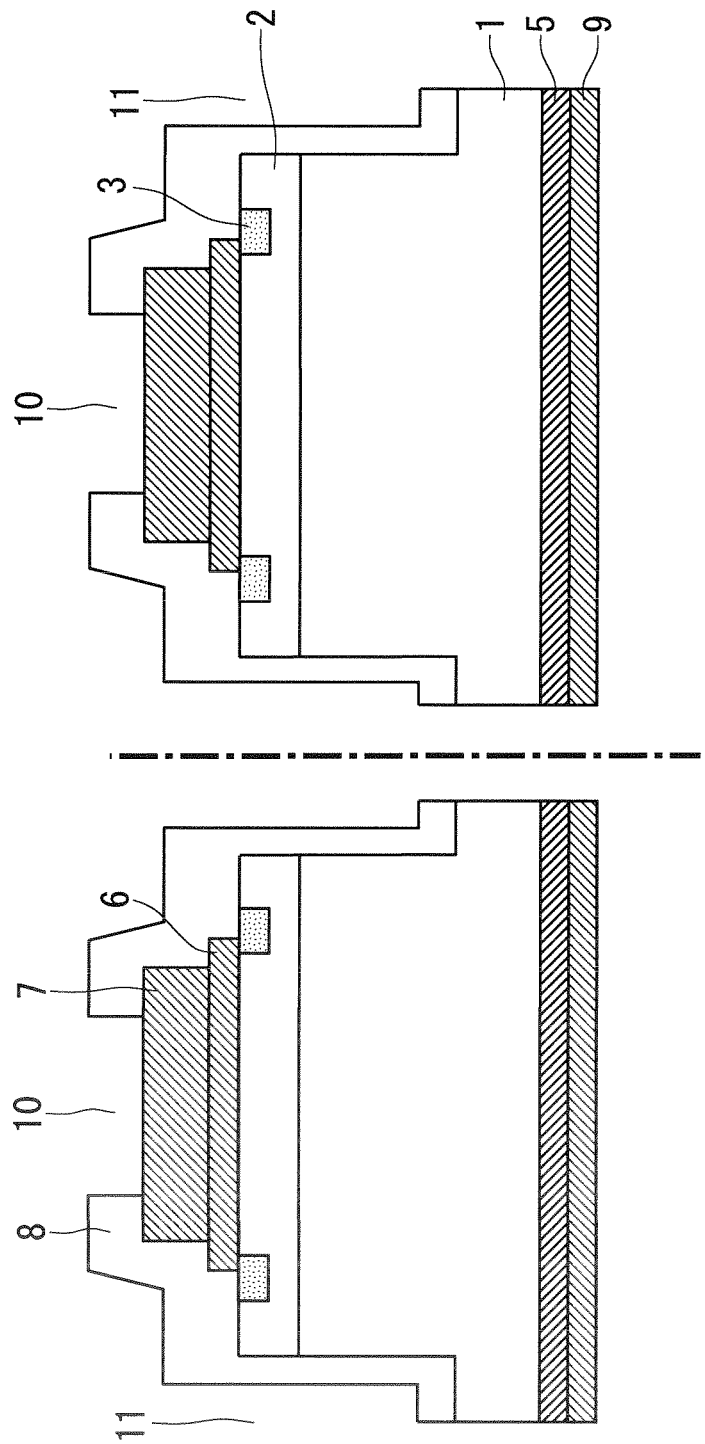

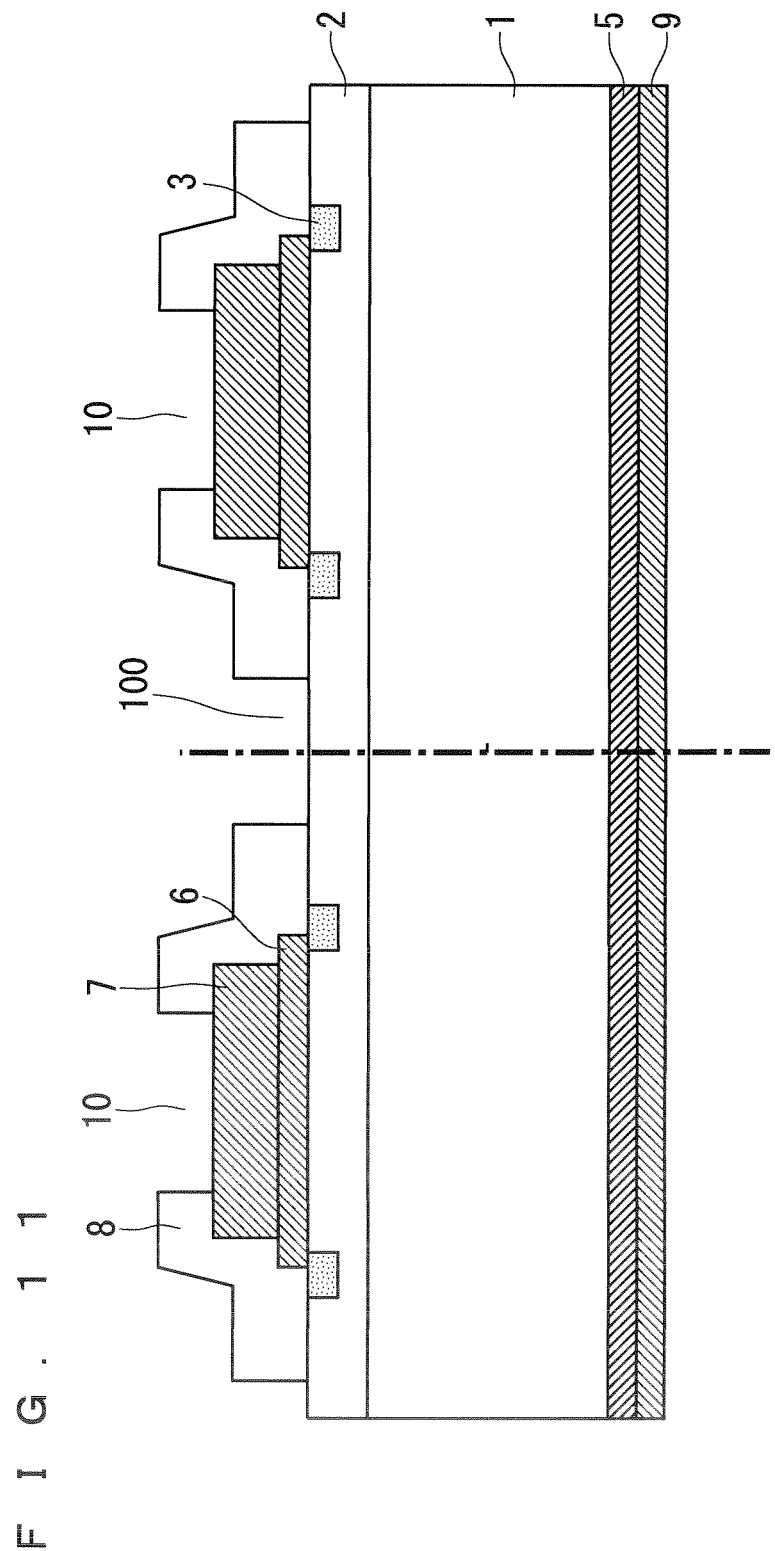

F I G . 1 2
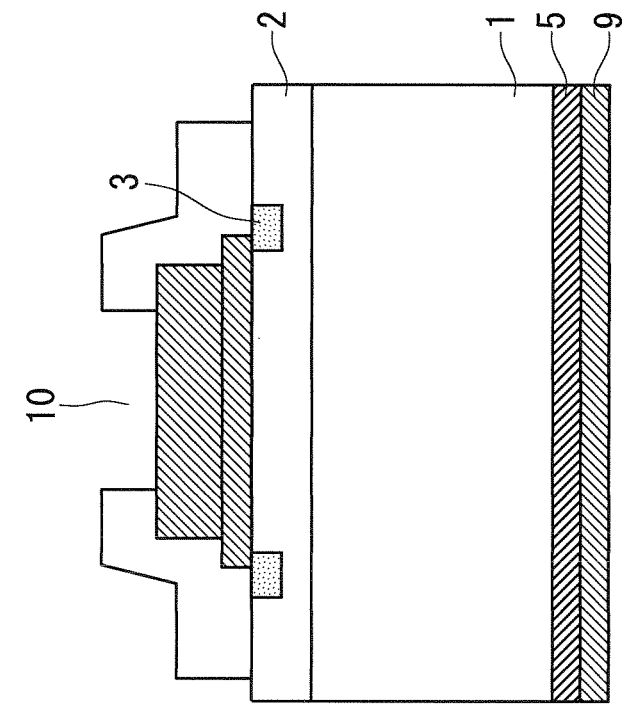
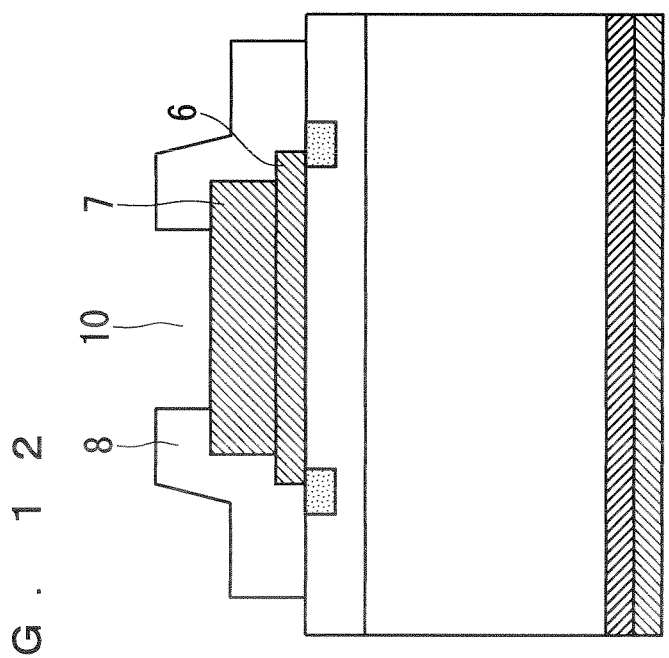

ously, following this operation, a polyimide (hereinafter, PI) requiring cure heating of approximately 350° C. is formed as a passivation film, and finally, rear metallization of Ni/Au is performed to complete the wafer processing.

SILICON CARBIDE SEMICONDUCTOR DEVICE AND MANUFACTURING METHOD THEREOF

BACKGROUND OF THE INVENTION

1. Field of the Invention

The present invention relates to a silicon carbide semiconductor device and a method of manufacturing the silicon carbide semiconductor device.

2. Description of the Background Art

As compared to silicon (Si), a silicon carbide (hereinafter, SiC) semiconductor is generally known to have a larger breakdown electric field, band gap, and coefficient of thermal conductivity. Because of a large band gap and coefficient of thermal conductivity, a silicon carbide semiconductor has excellent heat resistance, which enables operation at high temperatures and simple cooling. Furthermore, because of a large breakdown electric field, a silicon carbide semiconductor is easily made into a thin type and has a low loss, which enables operation at high temperatures.

In the design of the SiC Schottky Barrier Diode (hereinafter, SiC-SBD) and SiC-MOSFET (Metal-Oxide-Semiconductor Field-Effect Transistor), the breakdown electric field is 2.8 MV/cm when SiC is used, as compared to 0.3 MV/cm when silicon is used. If the thickness and the termination structure of the drift epitaxial layer, which is an active layer, is decided by taking advantage of this characteristic, then for example, the drift epitaxial layer may be around 1/10 of a case where silicon is used, if SiC having a breakdown electric field of approximately 10 times of silicon is used.

A kV-class high voltage SiC-SBD is configured by forming a Schottky electrode on the n-type SiC epitaxial layer.

In this structure, because an electric field can easily become concentrated on the periphery of the junction surface between the epitaxial layer and the Schottky electrode, a p-type termination structure needs to be formed for alleviating the electric field concentration, on the surface layer of the periphery of the junction surface (Schottky junction surface).

Generally, when forming the p-type termination structure, a method in which a p-type impurity, such as Al (aluminum) and B (boron), is ion-implanted into the n-type epitaxial layer, and then activation annealing is performed by high-temperature heat treatment at a temperature of 1500° C. or more, is used. Next, back polishing and back ohmic formation are performed, and a Schottky junction is formed on the surface. Additionally, aluminum of approximately 5 μm thickness is generally formed as a pad during wire bonding (WB). Conventionally, following this operation, a polyimide (hereinafter, PI) requiring cure heating of approximately 350° C. is formed as a passivation film, and finally, rear metallization of Ni/Au is performed to complete the wafer processing.

When a wafer test (hereinafter, WT) and a chip test (hereinafter, CT) need to be performed for evaluating the electrical properties of the element, then after performing WT, the element is segmented into individual chips by dicing, and CT is performed. The aforementioned one is the general process order.

The PI is formed so as to cover each of the surface electrode ends other than the surface electrode pad opening, the surface electrode end other than the dicing line opening, and the vicinity of the termination structure.

During normal PI formation, a kind of groove formation is not performed at the location corresponding to the chip end of the substrate surface, and therefore, the PI is not formed on the side walls of individual elements.

By contrast, the below-mentioned case example has been confirmed as a technique for forming a passivation film of the PI, for example, on the side walls of individual elements for any purpose.

Japanese Patent Application Laid-Open No. 2005-012206 describes a method of dividing a substrate in which a GaN crystalline layer is formed on a sapphire substrate, into chips, and more particularly describes in detail the chipping measures.

As regards the method of manufacturing the GaN element, measures against chipping in the cleavage and increased cutting amount during dicing are described. Furthermore, a process of covering the side walls inside the concave portion for electrodes with a passivation film is described.

Japanese Patent Application Laid-Open No. 2005-012206 describes that the depth of the groove that is to be formed is preferred to be 1 to 100 μm, and particularly preferred to be in the range of 1 to 50 μm, and breaking the formed groove in the end is not considered.

Japanese Patent Application Laid-Open No. 2000-183282 describes a method of simplifying the extraction of rejected chips and enabling the protection of chips during the manufacturing of modules by providing an insulating frame called a chip frame. According to the method, a smaller size and lower inductance can also be achieved.

Japanese Patent Application Laid-Open No. 2009-224641 describes a structure in which a conductor layer is formed on the entire end surface.

Japanese Patent Application Laid-Open No. 2004-064028 describes a method of forming a concave portion of 0.1 μm or more and 10 μm or less by laser scribing during the manufacturing of a silicon solar cell.

Japanese Patent Application Laid-Open No. 2006-156658 describes a structure having a concave portion on the element back surface with the purpose of reducing the on-resistance while retaining the substrate strength.

As described above, by taking advantage of the characteristic that the breakdown electric field is 2.8 MV/cm when SiC is used, as compared to the 0.3 MV/cm when silicon is used, the thickness or the termination structure of the drift epitaxial layer, which is an active layer, is decided.

When SiC having a breakdown electric field is approximately 10 times of a case where silicon is used, the drift epitaxial layer may be around 1/10 of a case where silicon is used. Even the dimension in the surface direction of the termination structure may be around 1/10 of a case where silicon is used, if an SiC material is used.

An electric discharge might occur during the evaluation of the electrical properties depending on the electric field concentration brought on as a result of the shape of the chip end, as well as the state of the chip affected by the ambient atmosphere.

Due to segmentation into individual chips, the electric discharge occurs easily in the individual elements with exposed side walls (side surfaces) on which the PI is not formed, which gives rise to the problem of occurrence of an electric discharge during CT even when the electric discharge does not occur during WT.

SUMMARY OF THE INVENTION

An object of the present invention is to provide a silicon carbide semiconductor device and a method of manufacturing the silicon carbide semiconductor device by which the occurrence of an electric discharge in the silicon carbide semiconductor substrate segmented into a plurality of chips, after the semiconductor substrate has been segmented, can be suppressed.

The silicon carbide semiconductor device according to the present invention includes a silicon carbide semiconductor substrate, an epitaxial layer formed on the silicon carbide semiconductor substrate and having a lower concentration of impurity than the silicon carbide semiconductor substrate, an electrode formed on the epitaxial layer, and an insulating film formed by covering at least an end of the electrode and an end and a side surface of the epitaxial layer.

Furthermore, the method of manufacturing the silicon carbide semiconductor device according to the present invention includes a step (a) of forming an epitaxial layer having a lower concentration of impurity than the silicon carbide semiconductor substrate, on the silicon carbide semiconductor substrate, a step (b) of forming a plurality of electrodes on the epitaxial layer, a step (c) of forming a groove deeper than a lower surface of the epitaxial layer, on the epitaxial layer sandwiched by each of the electrodes, a step (d) of forming an insulating film by covering at least an end of the electrodes, and an end and exposed side surface of the epitaxial layer, and a step (e) of dividing the silicon carbide semiconductor substrate at a portion in which the groove is formed.

According to the present invention, the exposure of the side surfaces of the epitaxial layer can be prevented, which makes it possible to suppress the occurrence of an electric discharge.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 to FIG. 10 are cross-sectional views each explaining a method of manufacturing a silicon carbide semiconductor device according to an embodiment of the present invention.

FIG. 11 to FIG. 12 are cross-sectional views each explaining a method of manufacturing a silicon carbide semiconductor device according to a prerequisite technique of the present invention.

DESCRIPTION OF THE PREFERRED EMBODIMENTS

Figure 1:
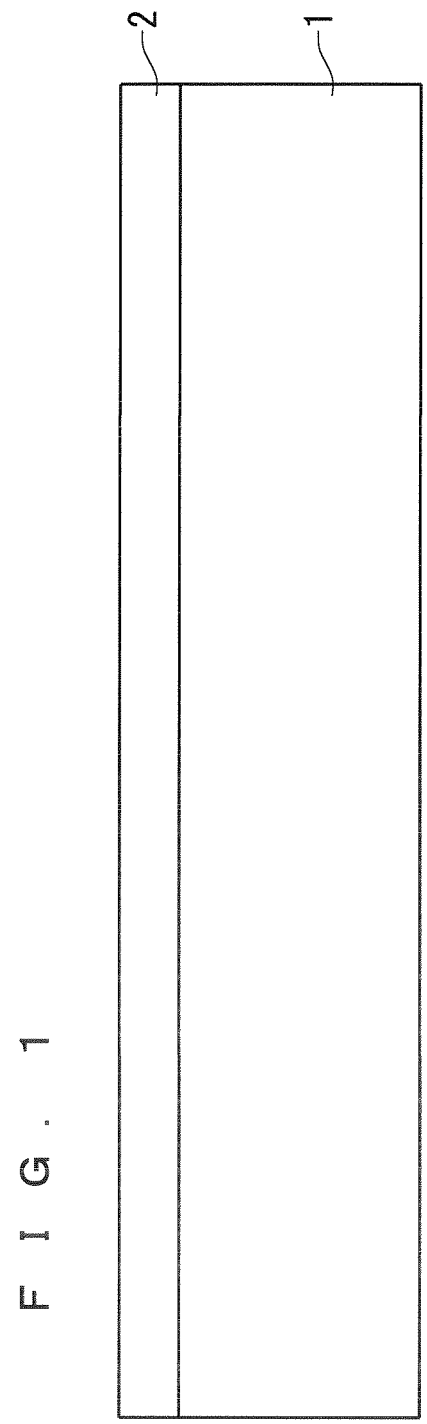

As a prerequisite technique of the present invention, a PI 8 is formed so as to cover each of surface electrode ends other than a surface electrode pad opening 10, a surface electrode end other than a dicing line opening 100, and the vicinity of the termination structure, as illustrated in FIG. 11.

During normal PI 8 formation, a kind of groove formation is not performed at the location corresponding to a chip end of the n+ type substrate 1 surface, and therefore, as illustrated in FIG. 12, the PI 8 is not formed as an insulating film on the side walls (side surfaces) of individual elements when segmented into individual chips.

An electric discharge might occur during the evaluation of the electrical properties depending on the electric field concentration brought on as a result of the shape of the chip end, as well as the state of the chip affected by the ambient atmosphere.

Due to segmentation, the electric discharge occurs easily in the individual elements with exposed side walls (side surfaces) on which the PI 8 is not formed, which might result in the occurrence of an electric discharge during CT even when the electric discharge does not occur during WT.

In view of the aforementioned problem, the embodiment described below indicates a silicon carbide semiconductor device and a method of manufacturing the silicon carbide semiconductor device, by which the occurrence of an electric discharge in the silicon carbide semiconductor substrate segmented into a plurality of chips, after the semiconductor substrate has been segmented, can be suppressed.

First Embodiment

<Manufacturing Method>

An overview of the silicon carbide semiconductor device and the method of manufacturing the silicon carbide manufacturing device, of the present invention, is described hereafter using SiC-SBD as an example.

For example, an epitaxial growth of an n-type SiC layer is performed, by a CVD method, on a silicon surface (0001) of an n-type 4H-SiC substrate with a bore diameter of 4 inches and a 4° off-angle.

The concentration and thickness of the n-type epitaxial layer grown on the n-type 4H-SiC substrate is adjusted so as to achieve a desired breakdown voltage.

The formation of a mark for reference of alignment within the substrate which is necessary in the photoengraving process, formation of a p-type termination structure, back polishing, formation of an ohmic junction in the back surface, formation of a Schottky junction on the surface, and formation of a surface pad for wire bonding (hereinafter, WB), are subsequently performed.

As regards the depth of the groove, the groove must be at least deeper rather than equivalent to the thickness of the drift epitaxial layer. Although it depends on how the breakdown voltage is set, the thickness of the drift epitaxial layer ranges from a few micrometers to tens of micrometers. In view of formation of the PI on the side surfaces of the groove as well, the groove is desired to be of the same depth as the thickness of the epitaxial layer because the formation of the PI becomes difficult with the deepening of the groove.

On the other hand, when it is also possible to form the groove up to a depth that is two thirds of the thickness of the substrate, that is, the thickness of the 4-inch SiC substrate is in the range of 300 to 350 μm, the residual thickness on which dicing is not performed can be around 100 μm, for example.

This is because when segmenting is performed by mechanical breaking, chipping, which is a type of a loss, and reversely, excess protrusions called "burrs" are easy to occur in the residual thickness of SiC on which dicing is not performed, and these occur more easily and remarkably as the residual thickness of SiC is thicker. The dividing itself also becomes difficult.

Furthermore, in order to perform the processing from the half-cutting process and thereafter the PI formation and rear metallization, up to the WT for the evaluation of the electrical properties, without damaging the substrate state, it becomes necessary to secure the substrate strength. In the case of the aforementioned 4-inch SiC substrate, the thickness necessary for securing strength is around 100 μm, therefore, the substrate can be made thin up to the residual thickness described above.

The PI formation after half-cutting is assumed by a method of spin coating the liquid PI material in the same way as the normal wafer process.

As compared to photoresist used in the photoengraving process, normally, by spin coating the high viscous, jelly-type PI material at a rotational frequency corresponding to the target thickness, for example, at a rotational frequency of about 2000 to 3000 rpm, the PI thickness formed on the substrate surface is controlled, and at the same time, the uniformity inside the surface is improved.

However, the PI is considered to be formed completely after cure heating. A groove having a width of 50 to 100 μm, for example, can be formed on the SiC substrate surface by half-cutting, and PI is formed even in such a groove.

As regards the PI formed in this region, the target thickness and an excellent uniformity inside the surface, such as the normal substrate surface, cannot be achieved. However, the object of covering the side walls with SiC can be achieved. It is found that the dependence on the PI film thickness is small when preventing the phenomenon of electric discharge occurring in the corner of the chips.

Hereafter, the details of the method of manufacturing the silicon carbide semiconductor device according to a preferred embodiment of the present invention will be described with reference to FIG. 1 to FIG. 10. FIG. 1 to FIG. 10 are main cross-sectional views of SiC-SBD in the manufacturing process for explaining the manufacturing method of the first preferred embodiment of the present invention.

First of all, as illustrated in FIG. 1, in step 1, an n+ type substrate 1 including (0001) a silicon surface 4H-SiC and having an 8° or 4° off-angle is prepared. The electrical resistivity of the n+ type substrate 1 is about 0.02 Ω·cm.

Next, on the n+ type substrate 1, an n-type drift epitaxial layer 2 having an impurity concentration of about $5\times10^{15}/cm^3$ is made to grow to an extent of 5 to 30 μm, in accordance with the desired breakdown voltage of about 600 V to 3300 V. The drift epitaxial layer 2 must have a lower impurity concentration than the n+ type substrate 1.

Additionally, the alignment mark that is necessary during the next photoengraving process is formed by being etched to an extent of 0.3 μm on the SiC surface. This mark is not illustrated in the figure. In order to simplify the manufacturing process, the mark formation can be combined together with the next implantation step.

Figure 2:
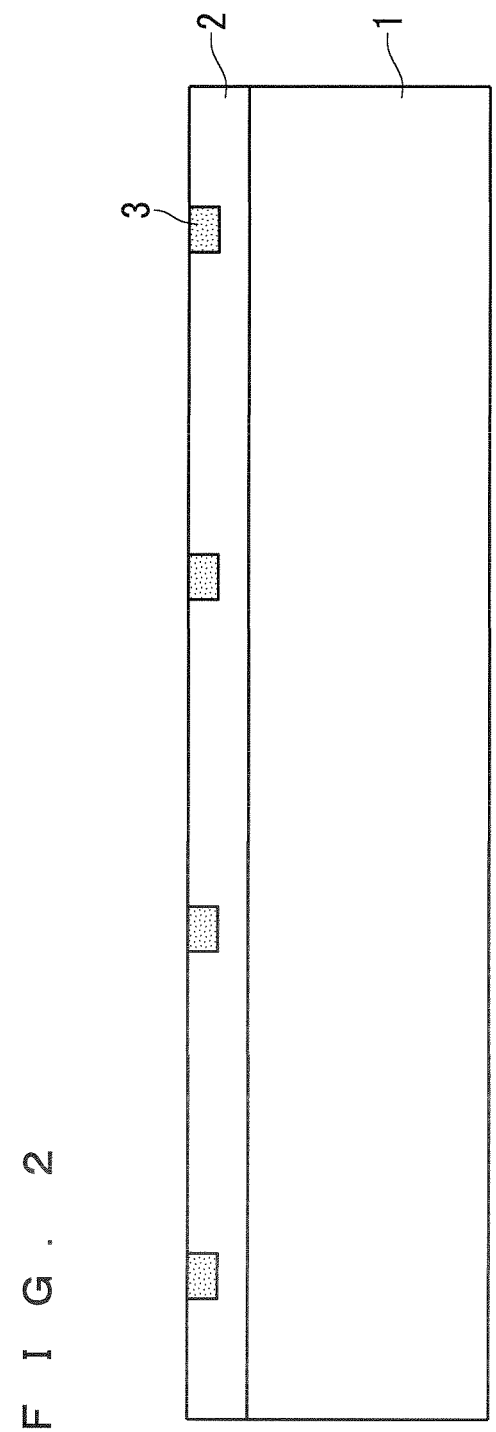

Next, as illustrated in FIG. 2, in step 2, in order to secure the desired breakdown voltage in a stable manner, a termination p-type implanted layer 3 is formed on the drift epitaxial layer 2 through Al ion implantation, as a structure for alleviating the electric field concentration of the Schottky electrode end.

As an example, a multi-ring structure having one type of concentration called FLR (Field Limiting Ring), and/or a termination structure having two types of concentrations called JTE (Junction Terminal Extension), which has a GR (Guard Ring) and a ring structure continuing outwards with a little less concentration, may be formed.

In both cases, in order to form a complete termination structure, the implanted layer must be activated. In the SiC process, generally, heat treatment is performed at a high temperature of about 1300 to 1700° C. At this time, capping with a graphite film for suppressing the occurrence of a step, called bunching step, may be performed. In an excellent process, the bunching step can be suppressed below 1 nm. If the p-type implanted layer can obtain an activation rate of 50% or more, and more preferably 90% or more, the p-type implanted layer functions as a termination structure. A higher activation rate can be interpreted as an index by which the recrystallization state of the crystal broken in the implantation step is changed to a more complete state, thus contributing to high reliability of the device.

Figure 3:
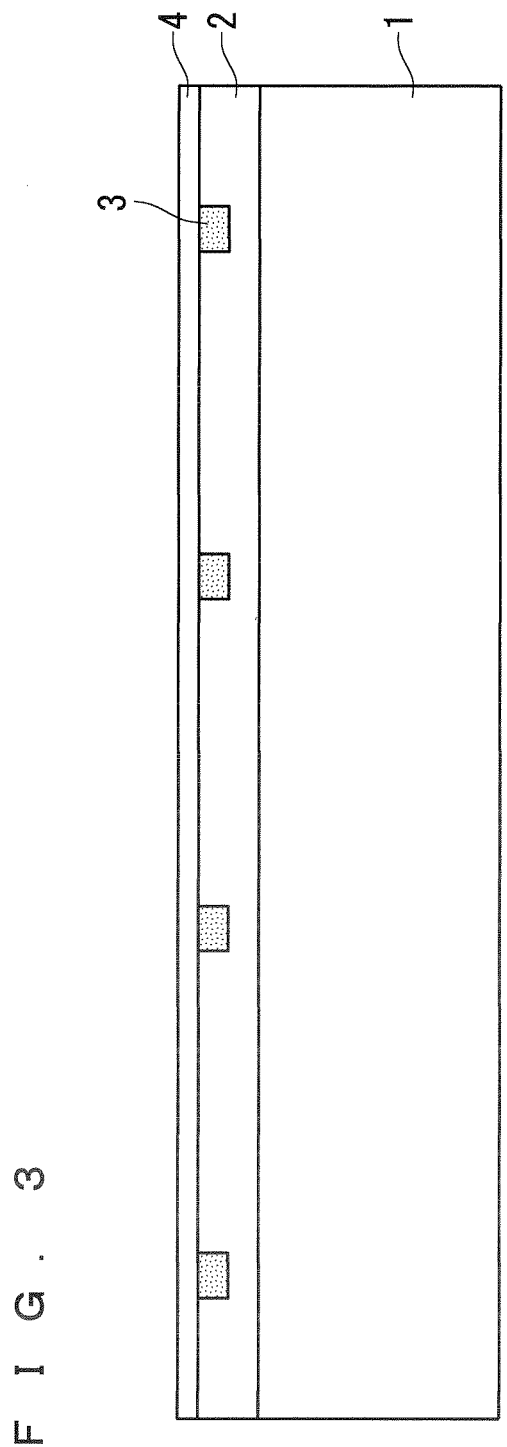

Next, as illustrated in FIG. 3, in step 3, in order to protect the surface of the n-type drift epitaxial layer 2 and the termination p-type implanted layer 3, an SiO₂ thermal oxide film 4 is formed.

Dry oxidation is effective for having excellent electrical properties of an SBD device, and it is desired to form an oxide film of 20 nm or more. During thermal oxidation, generally an SiO₂ thermal oxide film is formed on the back surface as well, but is not illustrated in FIG. 3. Following this, back polishing is performed to the desired thickness, and the back surface of clean SiC is exposed.

Figure 4:
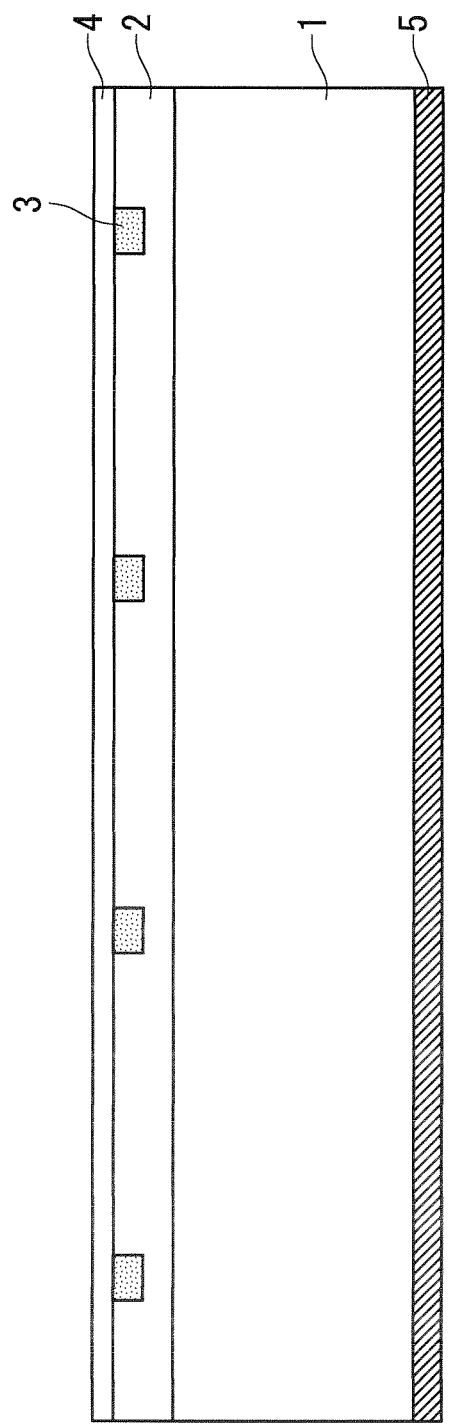

Next, as illustrated in FIG. 4, in step 4, a rear ohmic electrode 5 is formed. For example, Ni having a thickness of 100 nm is formed by sputtering, and by annealing the Ni at 1000° C., an excellent ohmic junction is achieved.

The SiO₂ thermal oxide film 4 formed on the surface in step 3 functions as a process protection film. Immediately before next forming the Schottky metal, the SiO₂ thermal oxide film 4 is etched and removed by hydrofluoric acid, and a clean SiC surface of the n-type drift epitaxial layer 2 is prepared.

Figure 5:
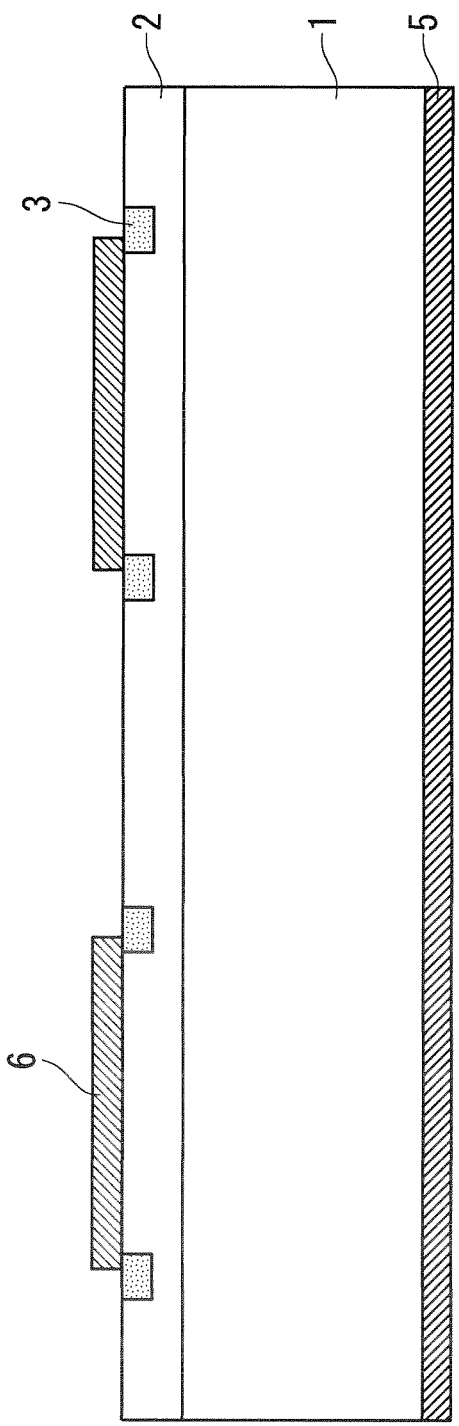

Next, as illustrated in FIG. 5, in step 5, a Schottky electrode 6 is formed in each position sandwiched by the termination p-type implanted layer 3 of the surface. For example, a film of Ti is formed on the entire surface by sputtering, and in the photoengraving process, electrode patterning is performed through etching by diluted hydrofluoric acid. In order to make the electrical properties more stable, heat treating the Schottky electrodes 6 at about 450° C. is effective.

When Ti is used as the Schottky metal, the junction location having the maximum effect on device characteristics in SiC-SBD is the Ti/SiC boundary surface. Therefore, as far as possible, it is desired to first form the top surface, which is the Ti Schottky electrode 6, and then form the rear surface, which is the ohmic electrode 5.

However, in order to form an excellent rear ohmic electrode 5 of Ni, annealing at about 1000° C. is necessary, and the Schottky electrode 6 of Ti is destroyed in this high-temperature process. As a result, there is no alternative but to select a technique in which the rear surface, which is the ohmic electrode 5, is always formed first and the top surface, which is the Ti Schottky electrode 6, is formed later.

Figure 6:
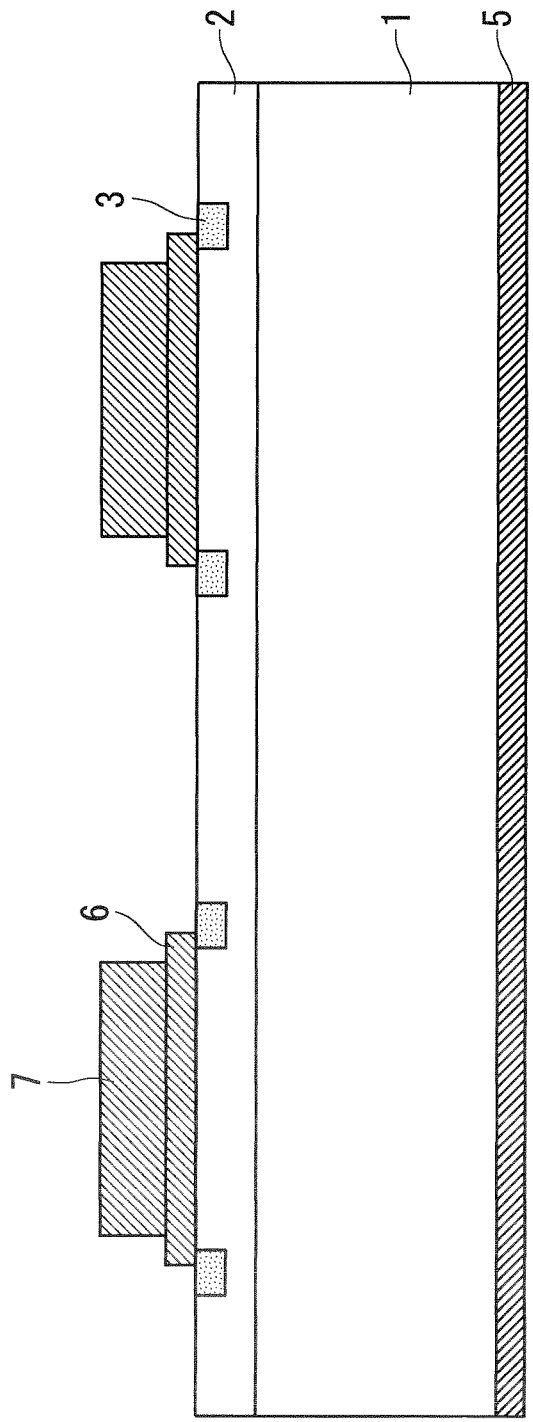

Next, as shown in FIG. 6, in step 6, a surface pad 7 for WB is formed. For example, a 5-μm film of Al is formed on the entire surface by sputtering, and similar to the aforementioned Ti, patterning is performed by photoengraving. Generally, phosphoric acid is mainly used as the Al etching liquid.

Figure 7:
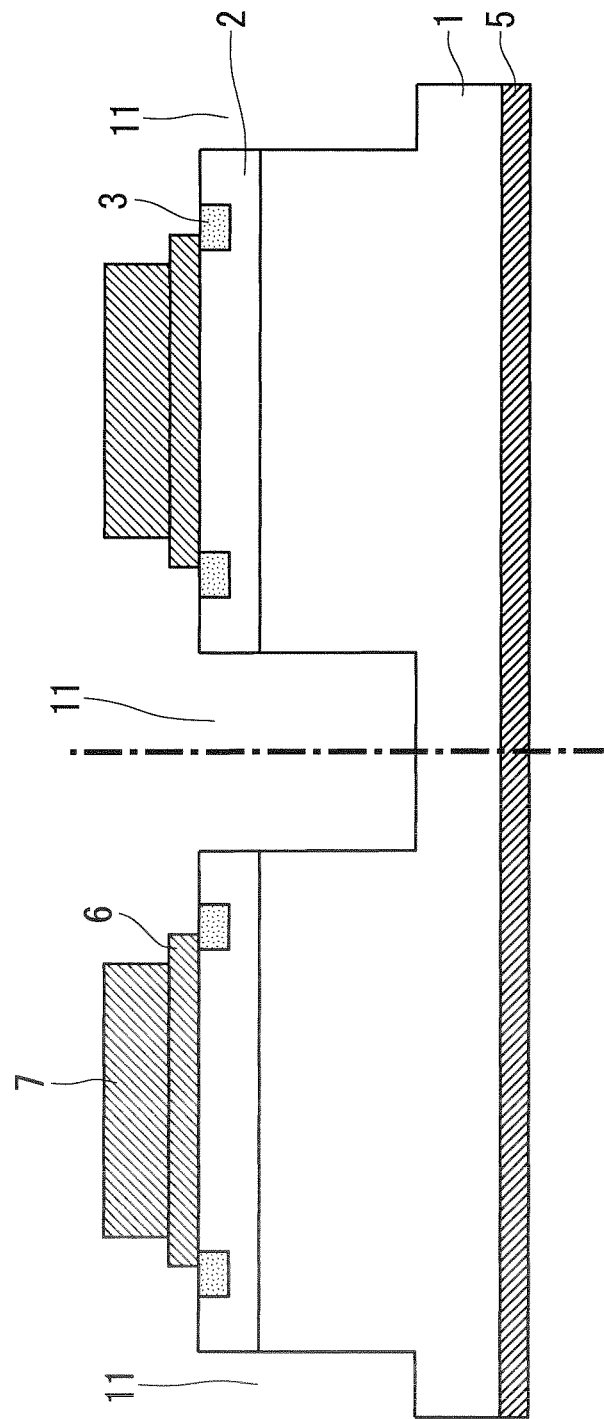

Next, as shown in FIG. 7, in step 7, before forming the PI 8, the groove 11 is formed by half-cutting by performing blade dicing on the n+ type substrate 1.

As regards the depth of the groove, the groove is formed to have a depth that is at least equivalent to the thickness of the drift epitaxial layer. That is, the groove 11 is formed with a depth such that the bottom surface of the groove 11 corresponds to the lower surface of the drift epitaxial layer 2, or the n+ type substrate 1 proximal to the lower surface. Although it depends on how the breakdown voltage is set, the thickness of the drift epitaxial layer ranges from a few micrometers to tens of micrometers. In view of formation of the PI on the side surfaces of the groove 11 as well, the groove is desired not to exceed the depth equivalent to the thickness of the epitaxial layer because the formation of the PI becomes difficult with the deepening of the groove.

On the other hand, when forming the groove up to a depth that is two thirds of the thickness of the substrate, that is, when the thickness of the 4-inch SiC substrate is in the range of 300 to 350 μm, the residual thickness on which dicing is not performed can be around 100 μm, for example.

This is because when dividing is performed by mechanical breaking, chipping, which is a type of a loss, and reversely, excess protrusions called "burrs" are easy to occur in the residual thickness of SiC on which dicing is not performed, and these occur more easily and remarkably as the residual thickness of SiC is thicker. Furthermore, the dividing itself becomes difficult as the residual thickness is thicker.

Furthermore, in order to perform the processing from the half-cutting process and thereafter the PI formation and rear metallization, up to the WT for the evaluation of the electrical properties, without damaging the substrate state, it becomes necessary to secure the substrate strength. In the case of the aforementioned 4-inch SiC substrate, the thickness necessary for securing strength is around 100 µm, therefore, the substrate can be made thin up to the residual thickness described above.

Figure 8:
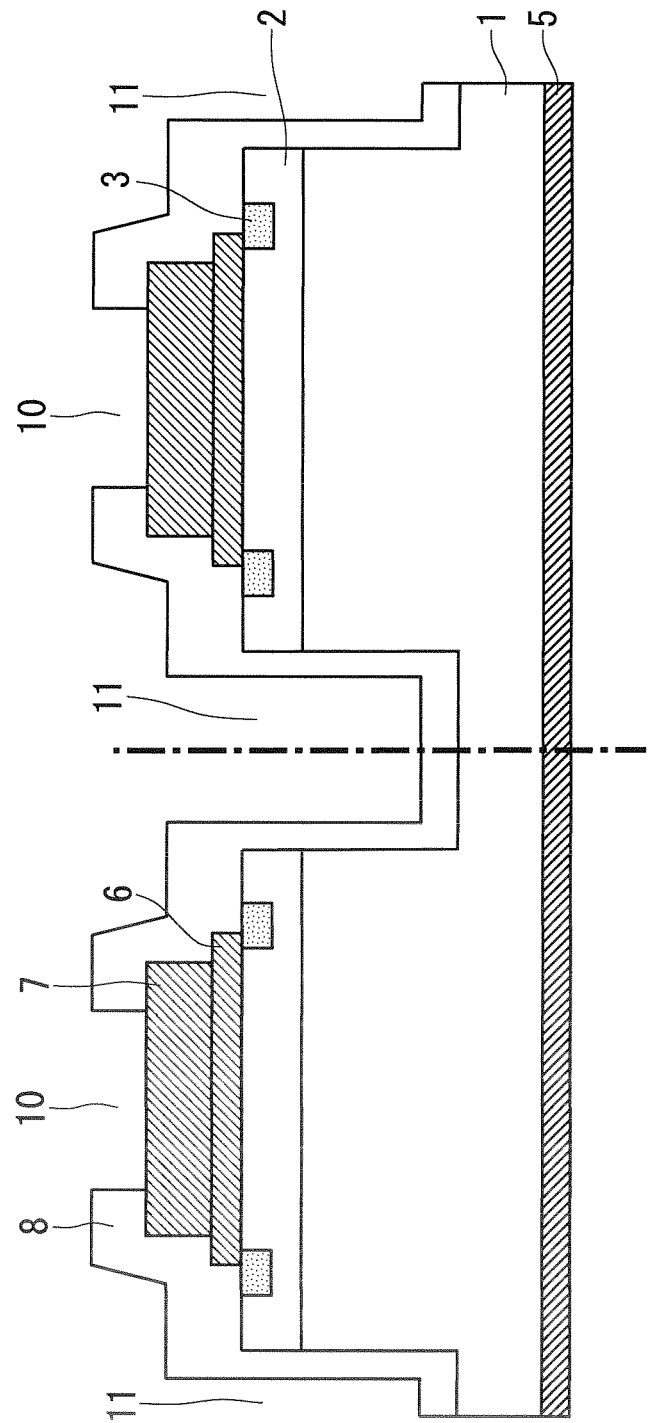

Next, as illustrated in FIG. 8, in step 8, the PI 8 formation after half-cutting is performed by a method of spin coating the liquid PI 8 material in the same way as the normal wafer process.

As compared to photoresist used in the photoengraving process, normally, by spin coating the high viscous, jelly-type PI material at a rotational frequency corresponding to the target thickness, for example, at a rotational frequency of about 2000 to 3000 rpm, the PI thickness formed on the substrate surface is controlled, and at the same time, the uniformity inside the surface is improved.

However, the PI 8 is considered to be formed completely after cure heating at about 350° C.

A groove 11 having a width of 50 to 100 µm, for example, can be formed on the n+ type substrate 1 surface by half-cutting, and PI 8 is formed even in such a groove. That is, the PI 8 is formed on the surface pad 7 and the Schottky electrode 6 (including the ends) excluding the surface electrode pad opening 10, and also on the surface (including the ends) and side surfaces of the drift epitaxial layer 2, and the exposed n+ type substrate 1.

As regards the PI 8 formed in this region, the target thickness and an excellent uniformity inside the surface, such as the normal n+ type substrate 1 surface, cannot be achieved. However, the object of covering the side walls with SiC can be achieved. It is found that the dependence on the PI 8 film thickness is small when preventing the phenomenon of electric discharge occurring in the corner of the chips.

Figure 9:
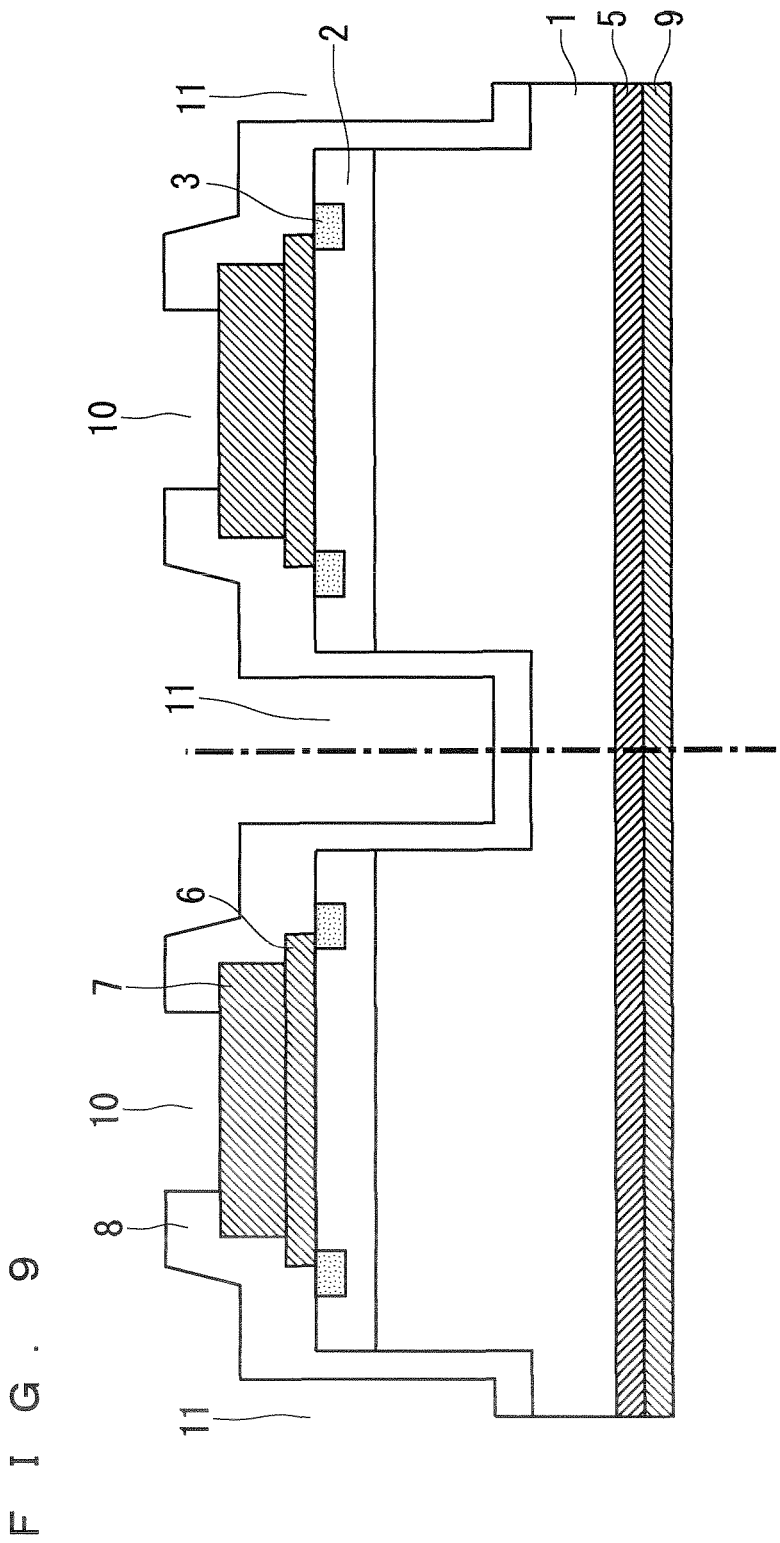

Next, as illustrated in FIG. 9, in step 9, a Ni and Au film is formed on the entire surface by sputtering, for example, as rear metallization 9. The wafer process is thus complete. If a wafer test (WT) is to be performed, it is performed in this state.

Next, as illustrated in FIG. 10, in step 10, as much portion as the thickness of the n+ type substrate 1 remaining during half-cutting is divided. In this way, the wafer is formed into chips by being divided at a portion in which the groove 11 is formed, and a structure in which the side surfaces of chips of the present invention are covered with the PI 8 can be achieved. To divide the chips after half-cut dicing, for example, mechanical breaking is effective.

As described above, with regard to the portions of the SiC chip on which the PI is formed, a structure of a silicon carbide semiconductor device in which the PI covers, as an insulating film, at least a portion corresponding to the thickness of the drift epitaxial layer 2, from among at least the corner of the chip (end of the drift epitaxial layer 2) from the electrode end at the side where the epitaxial layer is formed, and the side surfaces of the chip (side surfaces of the drift epitaxial layer 2), can be achieved.

By achieving a structure in which the PI covers even the corner of the chip as and the chip side surfaces, the phenomenon of electric discharge occurring after the chip test can be suppressed. Additionally, because of the formation of the PI 8 in the substrate state (state prior to dividing), the mass productivity becomes excellent.

In the finishing step of dicing performed after PI formation, generally, washing is performed with pure water. This is to remove the abrasive grains and scrapes resulting from dicing.

If PI on the surface of the SiC-SBD chip absorbs moisture, the breakdown voltage property might deteriorate. As a measure thereof, conventionally, after performing surface metallization, PI formation, and rear metallization formation, dicing and washing are performed, and if the PI has absorbed moisture as a result of washing with pure water during dividing into chips, the moisture inside the PI is removed by performing cure heating on chips at about 200° C.

Besides direct exposure to pure water as described above, absorption of moisture by the PI could also be due to the atmospheric humidity, however, the former results in a significant absorption of moisture similar to a state of immersion. Therefore, if at least the absorption of moisture due to washing after the dicing process can be avoided, the level of moisture absorption of the PI can be reduced significantly.

According to the manufacturing method of the present invention, half-cut dicing and washing with pure water can be completed before PI formation. That is, half-cut dicing and washing with pure water can be performed during step 7, prior to step 8 illustrated in FIG. 8.

Thus, the step of exposing and immersing the PI in pure water, which is absorbed readily, after the PI formation, is eliminated.

<Effect>

According to the preferred embodiment of the present invention, the silicon carbide semiconductor device includes an n+ type substrate 1, a drift epitaxial layer 2 formed on the n+ type substrate 1 and having a lower concentration of impurity than the n+ type substrate 1, a Schottky electrode 6 formed on the drift epitaxial layer 2, and a PI 8 formed as an insulating film by covering at least an end of the Schottky electrode 6 and an end and a side surface of the drift epitaxial layer 2.

According to such a silicon carbide semiconductor device, as a result of a structure in which even the corner of the chip as well as the chip side surfaces are covered with the PI 8, the phenomenon of electric discharge occurring after the chip test can be suppressed. Particularly, by covering the side surfaces of the drift epitaxial layer 2 with the PI 8, the electric discharge from the boundary between the drift epitaxial layer 2 and the n+ type substrate 1, where an electric discharge occurs easily, can be suppressed.

On the other hand, the deeper the groove is formed, the more difficult the formation of the polyimide becomes, and therefore, the depth can be suppressed within a range in which the polyimide can be formed in an excellent way.

Additionally, because of the formation of the PI in the substrate state, the mass productivity becomes excellent.

Furthermore, according to the preferred embodiment of the present invention, in the silicon carbide semiconductor device, the PI 8 that is formed as an insulating film does not cover the side surfaces of the n+ type substrate 1 other than the proximity of the drift epitaxial layer 2.

According to such a silicon carbide semiconductor device, the phenomenon of electric discharge occurring after the chip test can be suppressed, and at the same time, the PI 8 can be formed in an excellent way inside the groove 11. Because the PI 8 can be formed efficiently inside the groove 11, the mass productivity becomes excellent.

Furthermore, according to the preferred embodiment of the present invention, the method of manufacturing the silicon carbide semiconductor device includes a step (a) of forming a drift epitaxial layer 2 having a lower concentration of impurity than the n+ type substrate 1, on the n+ type substrate 1, a step (b) of forming a plurality of Schottky electrodes 6 on the drift epitaxial layer 2, a step (c) of forming a groove 11 deeper than the lower surface of the drift epitaxial layer 2, on the drift epitaxial layer 2 sandwiched by each of the Schottky electrodes 6, a step (d) of forming the PI 8 as an insulating film by covering at least an end of the Schottky electrodes 6, and an end and exposed side surface of the drift epitaxial layer 2, and a step (e) of dividing the n+ type substrate 1 at a portion in which the groove 11 is formed.

According to such a method of manufacturing a silicon carbide semiconductor device, the phenomenon of electric discharge occurring after the chip test can be suppressed, and at the same time, the PI 8 can be formed in an excellent way inside the groove 11. Because the PI 8 can be formed efficiently inside the groove 11, the mass productivity becomes excellent.

Furthermore, according to the preferred embodiment of the present invention, in the method of manufacturing the silicon carbide semiconductor device, the step (c) is a step of forming the groove 11 having a depth of up to the lower surface of the drift epitaxial layer 2, or the n+ type substrate 1 in the proximity of the lower surface.

According to such a method of manufacturing a silicon carbide semiconductor device, the PI 8 can be formed in an excellent way inside the groove 11.

Furthermore, according to the preferred embodiment of the present invention, the method of manufacturing the silicon carbide semiconductor device further includes a step (f) of washing a top of the n+ type substrate 1 and a top of the drift epitaxial layer 2 with pure water, before the step (d).

According to such a method of manufacturing a silicon carbide semiconductor device, the PI with a high moisture-absorption property can be prevented from being exposed and immersed in pure water, and the occurrence of an electric discharge due to the absorption of moisture by the PI can be suppressed.

Second Embodiment

<Manufacturing Method>

In the first preferred embodiment, before forming the PI 8, the groove 11 is formed by half-cutting by performing blade dicing on the n+ type substrate 1. This enables the realization of a structure in which the corner of the chip and the chip side surfaces are covered with the polyimide.

However, the PI may be coated after full-cut dicing (complete division) with the lower surface of the n+ type substrate 1 being pasted on to a sheet.

When adjoining chips are fused together during PI coating to hinder chip division, performing PI coating after expanding the sheet following full-cut dicing is effective. Thus, fusion of adjoining chips caused by the PI coating can be prevented.

<Modification>

The first and the second preferred embodiments have described the use of Ti as a Schottky electrode; however, other metals such as Ni, W, and Mo can also be used.

Additionally, the phenomenon of electric discharge after the chip test can be prevented in the same way even in devices other than the SiC-SBD, and other semiconductor devices such as JBS (Junction Barrier Schottky) and MOSFET.

<Effect>

According to the preferred embodiment of the present invention, in the method of manufacturing the silicon carbide semiconductor device, the step (c) is a step of fixing the lower surface of the n+ type substrate 1 on to a sheet, and then forming the groove 11 having a depth of up to the lower surface of the n+ type substrate 1.

According to such a method of manufacturing a silicon carbide semiconductor device, by coating the PI on the entire side surfaces, the phenomenon of electric discharge occurring after the chip test can be suppressed more effectively.

According to the preferred embodiment of the present invention, in the method of manufacturing the silicon carbide semiconductor device, the step (e) is a step of dividing the n+ type substrate 1 fixed on to a sheet, by expanding the sheet.

According to such a method of manufacturing a silicon carbide semiconductor device, the fusion of adjoining chips caused by the PI coating can be prevented.

The preferred embodiment of the present invention also describes the material quality, raw material, and conditions of execution for each component, however, these are not limited to the cited examples.

In the present invention, each preferred embodiment can be combined freely, any component of each preferred embodiment can be modified, or any component of each preferred embodiment can be omitted, within the scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a silicon carbide semiconductor device, comprising:
    a step (a) of forming an epitaxial layer having a lower concentration of impurity than a silicon carbide semiconductor substrate, on the silicon carbide semiconductor substrate;
    a step (b) of forming a plurality of electrodes on said epitaxial layer;
    a step (c) of forming a groove, by a dicing operation before mechanical breaking to divide the silicon carbide semiconductor substrate, deeper than a lower surface of said epitaxial layer, on said epitaxial layer sandwiched by each of said electrodes;
    a step (d) of forming an insulating film by covering at least an end of said electrodes, and covering an end and exposed side surface of said epitaxial layer such that a portion of the insulating film extends into the groove; and
    a step (e) of dividing said silicon carbide semiconductor substrate at a portion in which said groove is formed, wherein
    the insulating film covers a bottom surface of the groove and said step (e) is a step of dividing said silicon carbide semiconductor substrate by the mechanical breaking, in the absence of dicing, through both the insulating layer and the silicon carbide semiconductor substrate.

2. The method of manufacturing a silicon carbide semiconductor device according to claim 1, wherein
    said step (c) is a step of forming said groove having a depth of up to a lower surface of said epitaxial layer, or said silicon carbide semiconductor substrate in the proximity of the lower surface.

3. The method of manufacturing a silicon carbide semiconductor device according to claim 1, wherein
    said step (c) is a step of fixing a lower surface of said silicon carbide semiconductor substrate on to a sheet, and then forming said groove having a depth of up to said lower surface of the silicon carbide semiconductor substrate.

4. The method of manufacturing a silicon carbide semiconductor device according to claim 3, wherein
said step (e) is a step of dividing said silicon carbide semiconductor substrate fixed on to the sheet, by expanding said sheet.

5. A method of manufacturing a silicon carbide semiconductor device, comprising:
a step (a) of forming an epitaxial layer having a lower concentration of impurity than a silicon carbide semiconductor substrate, on the silicon carbide semiconductor substrate;
a step (b) of forming a plurality of electrodes on said epitaxial layer;
a step (c) of forming a groove, by a dicing operation before mechanical breaking to divide the silicon carbide semiconductor substrate, deeper than a lower surface of said epitaxial layer, on said epitaxial layer sandwiched by each of said electrodes;
a step (d) of forming an insulating film by covering at least an end of said electrodes, and an end and exposed side surface of said epitaxial layer;
a step (e) of dividing said silicon carbide semiconductor substrate at a portion in which said groove is formed by the mechanical breaking in the absence of dicing; and
a step (f) of washing a top of said silicon carbide semiconductor substrate and a top of said epitaxial layer with pure water, before said step (d).

* * * * *